(12) United States Patent
Tanino et al.

(10) Patent No.: US 12,095,355 B2
(45) Date of Patent: Sep. 17, 2024

(54) POWER SUPPLY CIRCUIT

(71) Applicant: OMRON Corporation, Kyoto (JP)

(72) Inventors: Kohei Tanino, Kyoto (JP); Masaaki Nagano, Kyoto (JP); Tomonori Watanabe, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 212 days.

(21) Appl. No.: 17/801,683

(22) PCT Filed: Dec. 16, 2020

(86) PCT No.: PCT/JP2020/047034
§ 371 (c)(1),
(2) Date: Aug. 23, 2022

(87) PCT Pub. No.: WO2021/176796
PCT Pub. Date: Sep. 10, 2021

(65) Prior Publication Data
US 2023/0128678 A1    Apr. 27, 2023

(30) Foreign Application Priority Data
Mar. 6, 2020    (JP) .................................. 2020-039023

(51) Int. Cl.
*H02M 1/32*    (2007.01)
*H02M 1/092*    (2006.01)
(Continued)

(52) U.S. Cl.
CPC ............. *H02M 1/32* (2013.01); *H02M 1/092* (2013.01); *H02M 3/156* (2013.01); *H02H 9/041* (2013.01); *H03K 17/691* (2013.01)

(58) Field of Classification Search
CPC ........ H02M 1/32; H02M 3/156; H02M 1/092; H03K 17/691
See application file for complete search history.

(56) References Cited

U.S. PATENT DOCUMENTS 5,596,466 A * 1/1997 Ochi .................. H02M 7/5387
361/103
5,744,943 A    4/1998 Tokai
(Continued)

FOREIGN PATENT DOCUMENTS

EP    3 476 046 B1    12/2019
JP    9-093909 A    4/1997
(Continued)

OTHER PUBLICATIONS

International Search Report for PCT/JP2020/047034 dated Feb. 9, 2021.
(Continued)

*Primary Examiner* — Rafael O Leon De Domenech
(74) *Attorney, Agent, or Firm* — Sughrue Mion, PLLC

(57) ABSTRACT

A power supply circuit includes a transistor having a drain connected to an input voltage, a gate, and a source; a diode; a choke coil; a capacitor; a transformer; a control circuit that provides a drive signal for turning on and off the transistor to a primary winding of the transformer based on an output voltage; an overvoltage detection circuit that outputs an overvoltage signal when the output voltage is an overvoltage; and a short circuit that short-circuits the gate and the source of the transistor in response to the overvoltage signal.

8 Claims, 5 Drawing Sheets

(51) Int. Cl.
*H02M 3/156* (2006.01)
*H02H 9/04* (2006.01)
*H03K 17/691* (2006.01)

(56) References Cited

U.S. PATENT DOCUMENTS

| | | | |
|---|---|---|---|
| 5,786,687 A | 7/1998 | Faulk | |
| 5,939,927 A | 8/1999 | Myers | |
| 11,095,226 B2* | 8/2021 | Arima | H02M 3/33523 |
| 2012/0020136 A1* | 1/2012 | Akaishi | B60L 58/10 |
| | | | 363/131 |
| 2012/0068614 A1* | 3/2012 | Ng | H04B 10/802 |
| | | | 363/16 |
| 2013/0207619 A1* | 8/2013 | Viancino | H03K 17/163 |
| | | | 320/166 |
| 2013/0264961 A1* | 10/2013 | Chang | H04B 10/802 |
| | | | 315/201 |
| 2016/0268902 A1* | 9/2016 | Yamaguchi | H02M 3/156 |
| 2017/0070142 A1 | 3/2017 | Sundararaj et al. | |
| 2017/0215240 A1* | 7/2017 | Sawada | H02M 3/33523 |
| 2017/0355267 A1* | 12/2017 | Zhou | B60L 50/10 |
| 2021/0044199 A1* | 2/2021 | Kim | H02H 3/202 |

FOREIGN PATENT DOCUMENTS

| | | |
|---|---|---|
| JP | 2010-130786 A | 6/2010 |
| JP | 2011-130543 A | 6/2011 |
| JP | 2018-007345 A | 1/2018 |
| WO | 2019/239453 A1 | 12/2019 |

OTHER PUBLICATIONS

Written Opinion for PCT/JP2020/047034 dated Feb. 9, 2021.
Extended European Search Report dated Mar. 7, 2024 in Application No. 20922887.3.

* cited by examiner

POWER SUPPLY CIRCUIT

CROSS REFERENCE TO RELATED APPLICATIONS

This application is a National Stage of International Application No. PCT/JP2020/047034 filed Dec. 16, 2020, claiming priority based on Japanese Patent Application No. 2020-039023 filed Mar. 6, 2020, the contents of each of which being herein incorporated by reference in their entireties.

TECHNICAL FIELD

The present disclosure relates to a power supply circuit, and more particularly to a step-down chopper circuit.

BACKGROUND ART

Japanese Patent Laying-Open No. 9-93909 (PTL 1) discloses a chopper type switching power supply circuit. The switching power supply circuit includes an N-channel MOSFET, an inductor, a capacitor, a diode, and a chopper control circuit.

CITATION LIST

Patent Literature

PTL 1: Japanese Patent Laying-Open No. 9-93909

SUMMARY OF INVENTION

Technical Problem

A drive circuit using a pulse transformer for driving a high-side switch (usually MOSFET) of a step-down chopper circuit is known. Since this drive circuit can reduce the number of components as compared with a case where the high-side switch is driven using an insulated gate driver or the like, the cost of the power supply device can be reduced. The pulse transformer is driven by a controller. The MOSFET is turned on when an ON signal is output from a drive terminal of the controller. On the other hand, when an OFF signal is output from the drive terminal of the controller (when the voltage of the drive terminal is 0 V), the MOSFET is turned off.

However, the pulse transformer drive circuit does not continue to draw out the charge between gate and source of the MOSFET in all the periods in which the drive terminal of the controller is 0 V. In a period in which the charge between the gate and the source of the MOSFET cannot be extracted in the off-period, when the charge is charged between the gate and the source of the MOSFET via parasitic capacitance of the MOSFET or the like, the MOSFET is turned on. In such a case, an output voltage of the power supply circuit is likely to increase. When the output voltage of the power supply circuit greatly increases, the components of the power supply circuit may be damaged.

An object of the present disclosure is to provide a power supply circuit capable of suppressing overvoltage.

Solution to Problem

A power supply circuit according to the present disclosure includes: a transistor having a drain connected to an input voltage, a gate, and a source; a diode having a cathode connected to the source of the transistor, and an anode connected to a common voltage node; a choke coil having a first end connected to the source of the transistor and the cathode of the diode, and a second end connected to an output node; a capacitor connected between the output node and the common voltage node; a transformer having a primary winding, and a secondary winding connected to the gate of the transistor; a control circuit configured to provide a drive signal for turning on and off the transistor, to the primary winding of the transformer, based on an output voltage as a voltage at the output node; an overvoltage detection circuit configured to output an overvoltage signal when the output voltage is an overvoltage; and a short circuit configured to short-circuit the gate and the source of the transistor in response to the overvoltage signal.

According to this disclosure, it is possible to suppress the output voltage of the power supply circuit from being in an overvoltage state.

In the above disclosure, the overvoltage detection circuit includes: a resistance voltage divider circuit configured to generate a voltage proportional to the output voltage of the power supply circuit; and a comparison circuit configured to output the overvoltage signal, when the voltage generated by the resistance voltage divider circuit exceeds a reference voltage, and the resistance voltage divider circuit includes a thermistor.

According to the present disclosure, a threshold for overvoltage detection can be changed according to a change in ambient temperature of the power supply circuit.

In the above disclosure, the thermistor is an NTC thermistor.

According to the present disclosure, the power supply circuit can be more reliably protected from the overvoltage at a low temperature.

In the above disclosure, the overvoltage detection circuit includes: a Zener diode having a cathode connected to the output node, and an anode; and a resistor connected between the anode of the Zener diode and the short circuit, and the Zener diode generates the overvoltage signal by causing a current to flow through the resistor, when the output voltage at the output node exceeds a predetermined voltage.

According to the present disclosure, the overvoltage can be detected with a simpler configuration.

In the above disclosure, the short circuit includes a photocoupler configured to electrically connect the gate and the source of the transistor in response to the overvoltage signal.

According to this disclosure, electrical insulation between an input side of the power supply circuit and an output side of the power supply circuit can be realized.

Advantageous Effects of Invention

According to the present invention, it is possible to provide a power supply circuit capable of suppressing overvoltage.

DESCRIPTION OF EMBODIMENT

Figure 1:
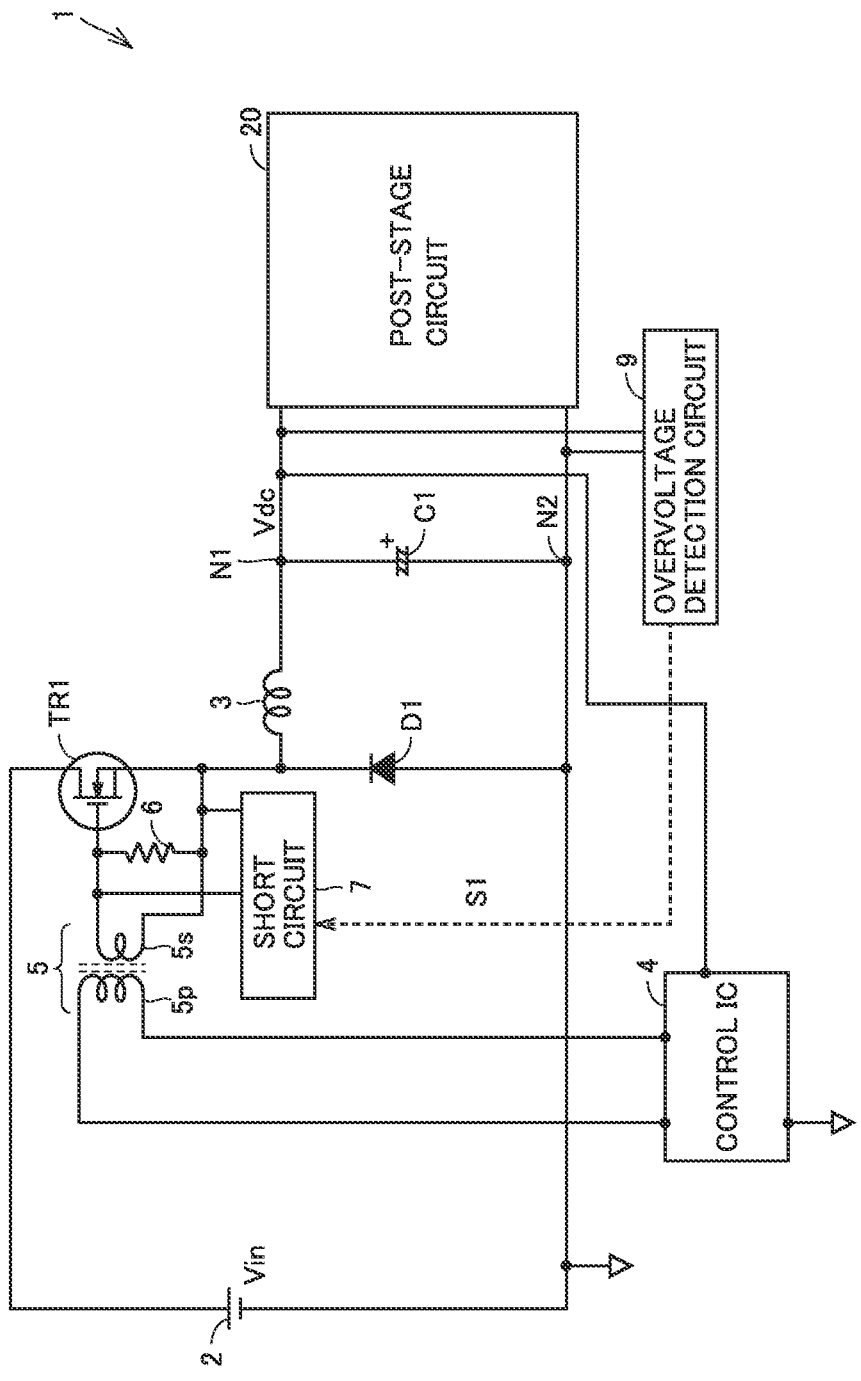
FIG. 1 is a circuit diagram showing a schematic configuration of a power supply circuit according to the present embodiment.

An embodiment of the present invention will be described in detail with reference to the drawings. The same or corresponding parts in the drawings are denoted by the same reference numerals, and the descriptions thereof will not be repeated.

Application Example

FIG. 1 is a circuit diagram showing a schematic configuration of a power supply circuit according to the present embodiment. As shown in FIG. 1, in this embodiment, a power supply circuit 1 is a step-down chopper circuit. Power supply circuit 1 includes a transistor TR1, a diode D1, a choke coil 3, a capacitor C1, a control IC4, a pulse transformer 5, a short circuit 7, and an overvoltage detection circuit 9.

Transistor TR1 is an N-channel MOSFET. Transistor TR1 has a drain, a gate, and a source. The drain of transistor TR1 is connected to an input voltage Vin. Input voltage Vin is a DC voltage generated by a DC power supply 2. DC power supply 2 may include an AC power supply and a rectifier circuit. Furthermore, a resistor 6 is connected between the gate and the source of transistor TR1.

Diode D1 has a cathode connected to the source of transistor TR1 and an anode connected to a common voltage node N2. In the present embodiment, the common voltage is a ground voltage.

Choke coil 3 has a first end connected to the source of the N-channel MOSFET and the cathode of diode D1, and a second end connected to an output node N1. Capacitor C1 is connected between output node N1 and common voltage node N2. Output node N1 is a node for outputting a voltage (output voltage Vdc) from power supply circuit 1. A post-stage circuit 20 is connected to output node N1 and common voltage node N2. Although not particularly limited, post-stage circuit 20 may be a DC/DC converter, for example.

Pulse transformer 5 includes a primary winding 5p and a secondary winding 5s. Primary winding 5p is connected to control IC4. Secondary winding 5s is connected to the gate of transistor TR1. Control IC4 is a control circuit that provides a drive signal for turning transistor TR1 (N-channel MOSFET) on and off to primary winding 5p of pulse transformer 5 based on output voltage Vdc that is a voltage at output node N1.

Overvoltage detection circuit 9 detects that output voltage Vdc is an overvoltage. When output voltage Vdc is an overvoltage, overvoltage detection circuit 9 outputs an overvoltage signal S1.

Short circuit 7 short-circuits the gate and the source of transistor TR1 in response to overvoltage signal S1 from overvoltage detection circuit 9. When the gate and the source of transistor TR1 are short-circuited, charges are extracted from gate-source capacitance of transistor TR1.

Figure 2:
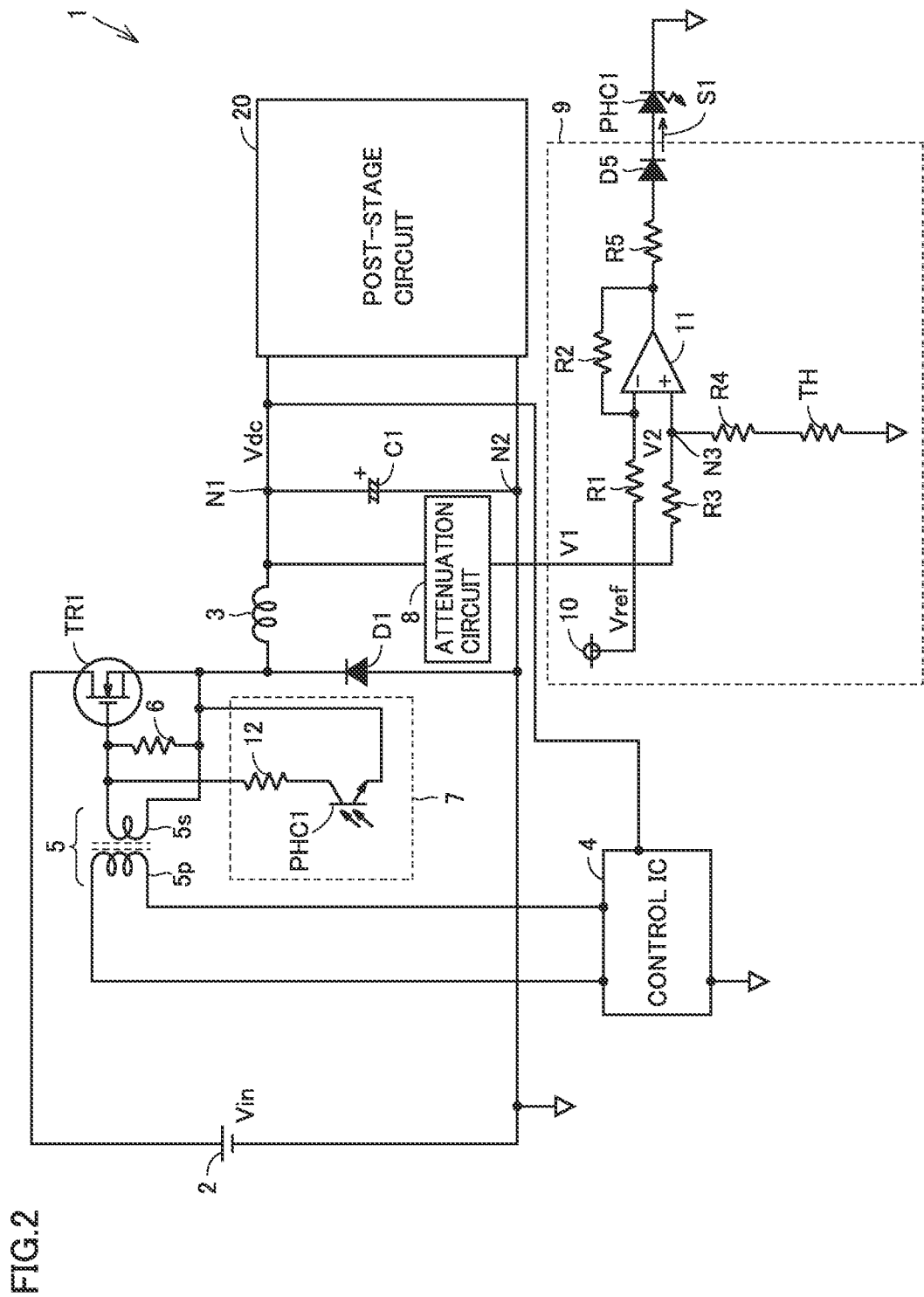
FIG. 2 is a diagram illustrating an example of a configuration of a short circuit and an overvoltage detection circuit illustrated in FIG. 1.

FIG. 2 is a diagram illustrating an example of a configuration of short circuit 7 and overvoltage detection circuit 9 illustrated in FIG. 1. As illustrated in FIG. 2, short circuit 7 includes a photocoupler PHC1 and a resistor 12.

Photocoupler PHC1 includes a light emitting element (light emitting diode) that receives overvoltage signal S1 to emit light and a phototransistor that is a light receiving element. The phototransistor is connected in series with resistor 12 between the gate and the source of transistor TR1. By adopting photocoupler PHC1 for short circuit 7, electrical insulation between the input side of power supply circuit 1 and the output side of power supply circuit 1 can be realized.

In the example of the configuration illustrated in FIG. 2, power supply circuit 1 further includes an attenuation circuit 8. Attenuation circuit 8 is a voltage dividing circuit, and attenuates output voltage Vdc at a predetermined ratio. Attenuation circuit 8 applies a voltage V1 proportional to output voltage Vdc to overvoltage detection circuit 9.

Overvoltage detection circuit 9 includes a reference voltage source 10, a differential amplifier 11, resistors R1 to R5, a thermistor TH, and a diode D5.

Resistor R1 is connected between reference voltage source 10 and an inverting input terminal (denoted as "−" in FIG. 2) of differential amplifier 11. Resistor R2 is connected between the inverting input terminal of differential amplifier 11 and an output of differential amplifier 11.

Resistors R3 and R4 and thermistor TH are connected in series between attenuation circuit 8 and a common voltage (ground voltage). Resistors R3 and R4 and thermistor TH constitute a voltage dividing circuit. A connection point N3 between resistors R3 and R4 is connected to a non-inverting input terminal (indicated by "+" in FIG. 2) of differential amplifier 11. When voltage V1 is supplied from attenuation circuit 8, a voltage V2 is generated at connection point N3. Voltage V2 is determined by a product of voltage V1 and a voltage division ratio.

Differential amplifier 11 is a comparator that compares voltage V2 at the non-inverting input terminal with a voltage Vref at the inverting input terminal. Differential amplifier 11 amplifies a voltage difference (V2−Vref) between voltage V2 and voltage Vref. An amplification factor of differential amplifier 11 is a ratio (R2/R1) between a resistance value of resistor R1 and a resistance value of resistor R2.

Resistor R5 is connected between the output of differential amplifier 11 and the anode of diode D5. The cathode of diode D5 is connected to the light emitting element of photocoupler PHC1. When overvoltage signal S1 output from differential amplifier 11 is applied to the light emitting element of photocoupler PHC1, the light emitting element emits light. As a result, the phototransistor of photocoupler PHC1 is turned on.

When the phototransistor of photocoupler PHC1 is turned on, the gate and the source of transistor TR1 are short-circuited. At this time, a current flows through the phototransistor. That is, the charge is extracted from the gate-source capacitance of transistor TR1.

Next, an operation of the circuit illustrated in FIG. 2 will be specifically described. Note that numerical values shown below are mere examples, and shall not limit the embodiment of the present invention.

It is assumed that a set value of output voltage Vdc is 380 V and input voltage Vin is 600 V. When output voltage Vdc reaches 450 V, transistor TR1 is forcibly turned off. That is, an overvoltage is detected when output voltage Vdc reaches 450 V.

Attenuation circuit 8 applies a voltage obtained by attenuating output voltage Vdc to 1/100 to differential amplifier 11.

When output voltage Vdc is 450 V, voltage V2 of the non-inverting input terminal of differential amplifier 11 is 4.5 V.

Differential amplifier 11 generates overvoltage signal S1. Voltage Vref from reference voltage source 10 is set to 4.2 V. A ratio (R2/R1) of the resistance value of resistor R1 and the resistance value of resistor R2 is set to 100. At this time, an output voltage of differential amplifier 11 becomes 30 V ((450/100−4.2)×100=30).

A current If corresponding to the voltage of overvoltage signal S1 flows through the light emitting element of photocoupler PHC1. Current If is expressed as If=30/R5 (R5 is a resistance value of resistor R5). When current If flows through the light emitting element, the phototransistor of photocoupler PHC1 is turned on. When the phototransistor is turned on, a current Ic flows between the collector and the emitter of the phototransistor. Current Ic is obtained by Ic=If*CTR (CTR: current transfer rate).

Figure 3:
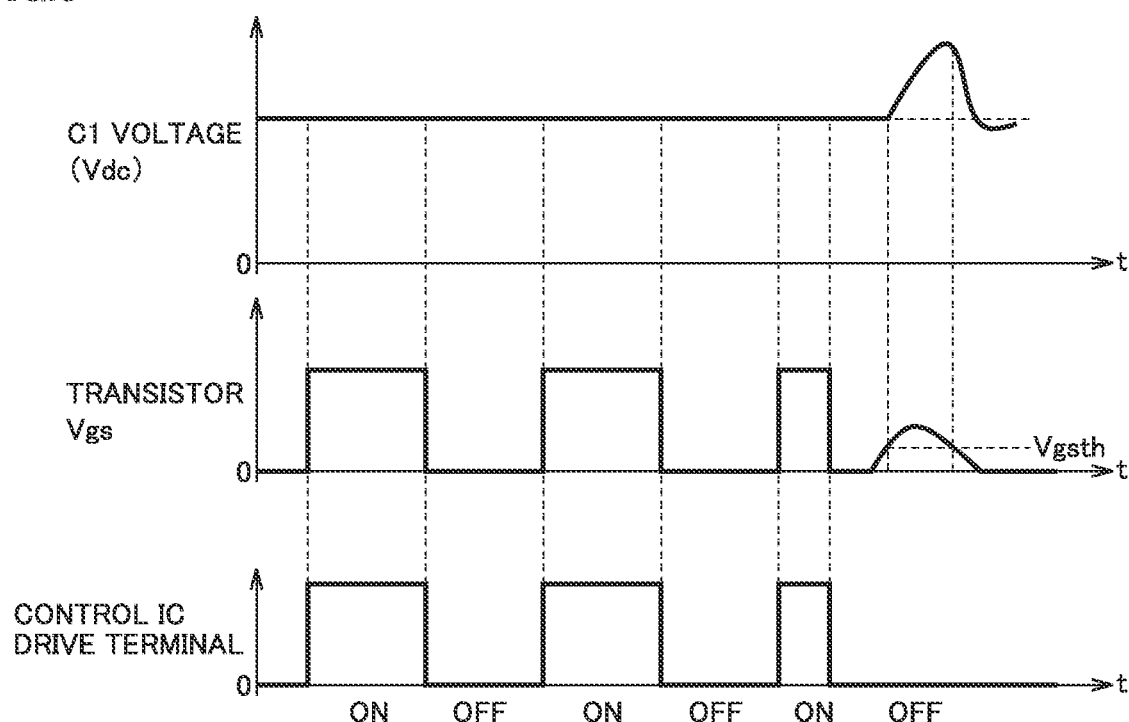
FIG. 3 is a waveform chart illustrating a problem that may occur when a transistor of a step-down chopper is driven by a pulse transformer.

FIG. 3 is a waveform chart illustrating a problem that may occur when the transistor of the step-down chopper is driven by the pulse transformer. As illustrated in FIGS. 1 and 2, control IC4 outputs a signal for turning on and off transistor TR1 from the drive terminal. An output signal of control IC4 is applied to primary winding 5p of pulse transformer 5. As a result, a voltage is induced in secondary winding 5s of pulse transformer 5.

A gate of transistor TR1 is connected to secondary winding 5s of pulse transformer 5. Basically, the voltage (gate voltage Vgs) of the gate of transistor TR1 changes following the signal output from control IC4. During a period in which the control signal from control IC4 is in an off state, a current flows through secondary winding 5s of pulse transformer 5. As a result, the gate-source capacitance of the MOSFET emits charges.

However, if the period in which the control signal from control IC4 is off is long, a period in which the current does not flow in secondary winding 5s of pulse transformer 5 occurs. Therefore, in a case where charges are accumulated in the gate-source capacitance of transistor TR1 via a parasitic capacitance or the like during this period, gate voltage Vgs may increase even though the control signal is in the off state.

Since capacitor C1 normally smooths output voltage Vdc, output voltage Vdc is prevented from greatly exceeding a set voltage. However, for example, when the ambient temperature of power supply circuit 1 is low, the capacitance of capacitor C1 decreases. Alternatively, when the ambient temperature of power supply circuit 1 is low, ESR (equivalent series resistance) of capacitor C1 increases. In such a case, smoothing of the output voltage by capacitor C1 is not sufficient, and thus output voltage Vdc may greatly increase as illustrated in FIG. 3.

Figure 4:
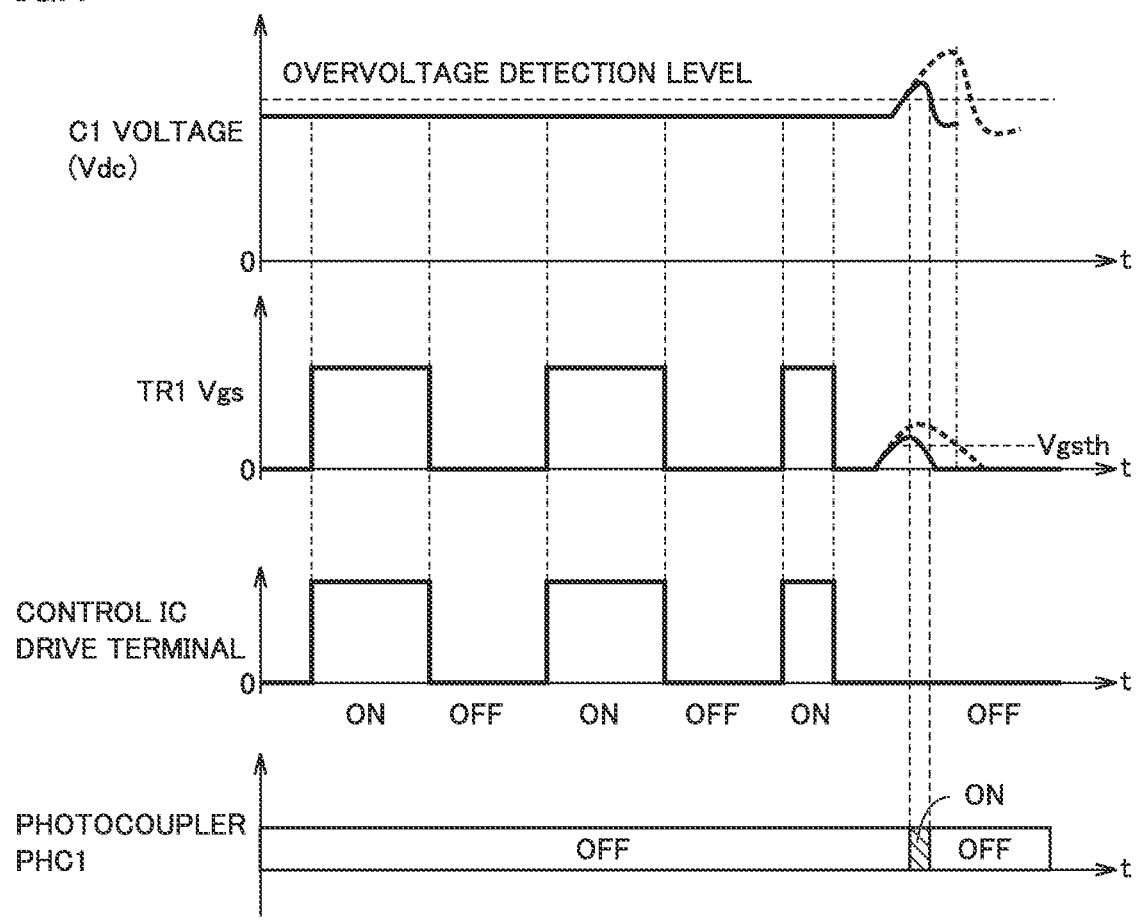
FIG. 4 is a waveform chart for explaining an operation of the power supply circuit according to the embodiment of the present invention.

FIG. 4 is a waveform chart for explaining an operation of power supply circuit 1 according to the embodiment of the present invention. As illustrated in FIG. 4, in the embodiment of the present invention, when output voltage Vdc reaches an overvoltage detection level, overvoltage detection circuit 9 activates short circuit 7. In the example of the configuration illustrated in FIG. 2, overvoltage detection circuit 9 turns on photocoupler PHC1 by overvoltage signal S1. As photocoupler PHC1 is turned on, the gate and the source of transistor TR1 are short-circuited. As a result, the charge is extracted from the gate-source capacitance of transistor TR1, and gate voltage Vgs decreases. Since gate voltage Vgs is lower than a threshold voltage Vgsth, transistor TR1 is turned off. In the present embodiment, since transistor TR1 can be forcibly turned off, a significant increase in output voltage Vdc can be suppressed. Therefore, output voltage Vdc can be suppressed to be equal to or lower than the set voltage.

As described above, particularly when the ambient temperature of power supply circuit 1 is low, output voltage Vdc is likely to increase due to a decrease in the capacitance of capacitor C1 or an increase in the ESR of capacitor C1. As shown in FIG. 2, in the present exemplary embodiment, thermistor TH is connected to resistor R4 in series. As a result, the overvoltage detection threshold can be changed according to the change in the ambient temperature of power supply circuit 1.

Preferably, thermistor TH is an NTC thermistor. Since a resistance value of the NTC thermistor increases as the temperature decreases, a total value (value of a combined resistor) of a resistance value of resistor R4 and a resistance value of thermistor TH increases. Since a ratio of the value of the combined resistor to a resistance value of resistor R3 increases, a threshold of output voltage Vdc for operating overvoltage detection circuit 9 can be lowered. When the ambient temperature is low, for example, a function of the overvoltage detection can be operated when output voltage Vdc is 410 V, and therefore power supply circuit 1 can be more reliably protected from the overvoltage. Furthermore, the amplification factor of differential amplifier 11 can also be increased.

Figure 5:
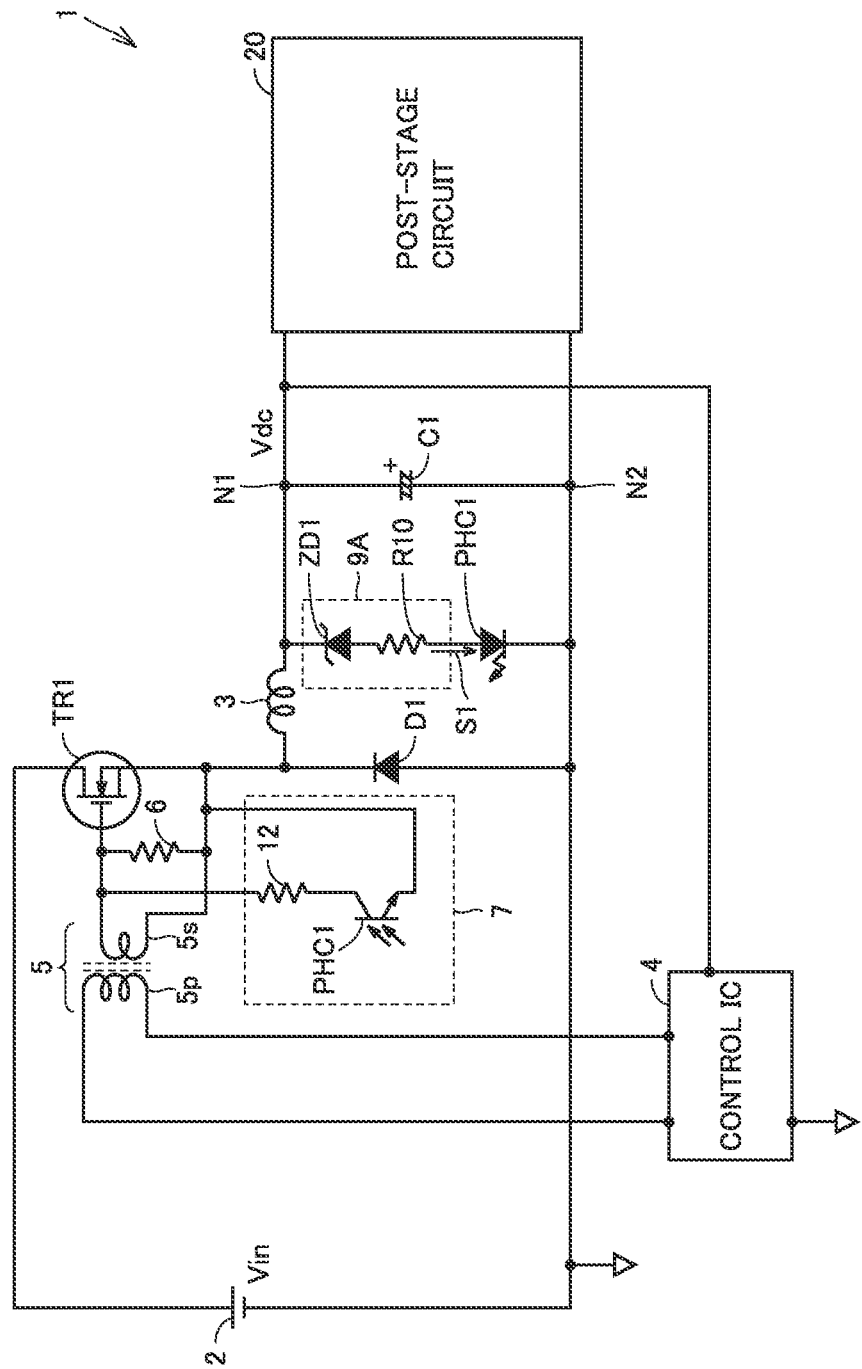
FIG. 5 is a circuit diagram showing another example of the configuration of the power supply circuit according to the present embodiment.

Note that the configuration of the overvoltage detection circuit is not limited to the configuration illustrated in FIG. 2. FIG. 5 is a circuit diagram showing another example of the configuration of the power supply circuit according to the present embodiment. Power supply circuit 1 includes an overvoltage detection circuit 9A instead of overvoltage detection circuit 9. Overvoltage detection circuit 9A includes a Zener diode ZD1 and a resistor R10. A cathode of Zener diode ZD1 is connected to output node N1. Resistor R10 is connected between an anode of Zener diode ZD1 and the light emitting element of photocoupler PHC1. Zener diode ZD1, resistor R10, and the light emitting element (light emitting diode) of photocoupler PHC1 are connected in series between output node N1 and common voltage node N2.

In the configuration illustrated in FIG. 5, a Zener voltage Vz of Zener diode ZD1 corresponds to the threshold voltage of output voltage Vdc for detecting the overvoltage. When output voltage Vdc exceeds the Zener voltage of Zener diode ZD1, a current flows through Zener diode ZD1 and resistor R10. That is, overvoltage signal S1 is generated. As a result, the light emitting element of photocoupler PHC1 emits light, and the phototransistor of photocoupler PHC1 is turned on. Therefore, similarly to the configuration illustrated in FIG. 2, the charge is extracted from the gate-source capacitance of transistor TR1, and gate voltage Vgs decreases. Since gate voltage Vgs is lower than a threshold voltage Vgsth, transistor TR1 is turned off. Therefore, a significant increase in output voltage Vdc can be suppressed. Furthermore, according to the configuration illustrated in FIG. 5, the configuration of the overvoltage detection circuit can be simplified as compared with the configuration illustrated in FIG. 2.

Similarly, the configuration of short circuit 7 is not limited to the configuration illustrated in FIGS. 2 and 5. Short circuit 7 can have various configurations so as to be able to extract a charge between the gate and the source of the MOSFET (transistor TR1).

SUPPLEMENTARY NOTE

The above-described embodiment includes the following technical concepts.

Configuration 1

A power supply circuit (1) includes:
a transistor (TR1) having a drain connected to an input voltage (Vin), a gate, and a source;
a diode (D1) having a cathode connected to the source of the transistor (TR1) and an anode connected to a common voltage node (N2);
a choke coil (3) having a first end connected to the source of the transistor (TR1) and the cathode of the diode (D1) and a second end connected to an output node (N1);
a capacitor (C1) connected between the output node (N1) and the common voltage node (N2);
a transformer (5) having a primary winding (5p) and a secondary winding (5s) connected to the gate of the transistor (TR1);
a control circuit (4) configured to provide a drive signal for turning on and off the transistor (TR1) to the primary winding (5p) of the transformer (5) based on an output voltage (Vdc) as a voltage at the output node (N1);
an overvoltage detection circuit (9, 9A) configured to output an overvoltage signal (S1) when the output voltage (Vdc) is an overvoltage; and
a short circuit (7) configured to short-circuit the gate and the source of the transistor (TR1) in response to the overvoltage signal (S1).

Configuration 2

The power supply circuit according to configuration 1, wherein
the overvoltage detection circuit (9) includes:
a resistance voltage divider circuit (R3, R4, TH) configured to generate a voltage (V2) proportional to the output voltage (Vdc) of the power supply circuit (1); and
a comparison circuit (11) configured to output the overvoltage signal (S1) when the voltage (V2) generated by the resistance voltage divider circuit (R3, R4, TH) exceeds a reference voltage (Vref), and
the resistance voltage divider circuit (R3, R4, TH) includes a thermistor (TH).

Configuration 3

The power supply circuit according to configuration 2, wherein the thermistor (TH) is an NTC thermistor.

Configuration 4

The power supply circuit according to configuration 1, wherein
the overvoltage detection circuit (9A) includes:
a Zener diode (ZD1) having a cathode connected to the output node (N1), and an anode; and
a resistor (R10) connected between the anode of the Zener diode (ZD1) and the short circuit (7), and
the Zener diode (ZD1) generates the overvoltage signal (S1) by causing a current to flow through the resistor (R10), when the output voltage (Vdc) at the output node (N1) exceeds a predetermined voltage.

Configuration 5

The power supply circuit according to any one of configurations 1 to 4, wherein
the short circuit (7) includes a photocoupler (PHC1) configured to electrically connect the gate and the source of the transistor in response to the overvoltage signal.

The embodiment disclosed herein should be considered to be illustrative in all respects and not restrictive. The scope of the present invention is defined by the claims, instead of the embodiment stated above, and it is intended that meanings equivalent to the claims and all modifications within the scope are included.

REFERENCE SIGNS LIST

1: power supply circuit, 2: DC power supply, 3: choke coil, 4: control IC, 5: pulse transformer, 5p: primary winding, 5s: secondary winding, 6, 12, R1 to R5, R10: resistance, 7: short circuit, 8: attenuation circuit, 9, 9A: overvoltage detection circuit, 10: reference voltage source, 11: differential amplifier, 20: post-stage circuit, C1: capacitor, D1, D5: diode, N1: output node, N2: common voltage node, N3: connection point, PHC1: photocoupler, S1: overvoltage signal, TH: thermistor, TR1: transistor, ZD1: Zener diode

The invention claimed is:
1. A power supply circuit comprising:
a transistor having a drain connected to an input voltage, a gate, and a source;
a diode having a cathode connected to the source of the transistor, and an anode connected to a common voltage node;
a choke coil having a first end connected to the source of the transistor and the cathode of the diode, and a second end connected to an output node;
a capacitor connected between the output node and the common voltage node;
a transformer having a primary winding, and a secondary winding connected to the gate of the transistor;
a control circuit configured to provide a drive signal for turning on and off the transistor, to the primary winding of the transformer, based on an output voltage as a voltage at the output node;
an overvoltage detection circuit configured to output an overvoltage signal when the output voltage is an overvoltage; and
a short circuit configured to short-circuit the gate and the source of the transistor in response to the overvoltage signal.
2. The power supply circuit according to claim 1, wherein the overvoltage detection circuit includes:
a resistance voltage divider circuit configured to generate a voltage proportional to the output voltage of the power supply circuit; and
a comparison circuit configured to output the overvoltage signal, when the voltage generated by the resistance voltage divider circuit exceeds a reference voltage, and
the resistance voltage divider circuit includes a thermistor.
3. The power supply circuit according to claim 2, wherein the thermistor is an NTC thermistor.
4. The power supply circuit according to claim 1, wherein the overvoltage detection circuit includes:

a Zener diode having a cathode connected to the output node, and an anode; and a resistor connected between the anode of the Zener diode and the short circuit, and the Zener diode generates the overvoltage signal by causing a current to flow through the resistor, when the output voltage at the output node exceeds a predetermined voltage.

5. The power supply circuit according to claim 1, wherein the short circuit includes a photocoupler configured to electrically connect the gate and the source of the transistor in response to the overvoltage signal.

6. The power supply circuit according to claim 2, wherein the short circuit includes a photocoupler configured to electrically connect the gate and the source of the transistor in response to the overvoltage signal.

7. The power supply circuit according to claim 3, wherein the short circuit includes a photocoupler configured to electrically connect the gate and the source of the transistor in response to the overvoltage signal.

8. The power supply circuit according to claim 4, wherein the short circuit includes a photocoupler configured to electrically connect the gate and the source of the transistor in response to the overvoltage signal.

* * * * *